United States Patent
Toshima et al.

(10) Patent No.: US 11,410,837 B2
(45) Date of Patent: *Aug. 9, 2022

(54) FILM-FORMING DEVICE

(71) Applicant: TOKYO ELECTRON LIMITED, Tokyo (JP)

(72) Inventors: Hiroyuki Toshima, Nirasaki (JP); Tatsuo Hatano, Nirasaki (JP); Tetsuya Miyashita, Nirasaki (JP); Shinji Furukawa, Nirasaki (JP); Junichi Takei, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 91 days.

This patent is subject to a terminal disclaimer.

(21) Appl. No.: 16/346,705

(22) PCT Filed: Oct. 23, 2017

(86) PCT No.: PCT/JP2017/038142
§ 371 (c)(1),
(2) Date: May 1, 2019

(87) PCT Pub. No.: WO2018/084010
PCT Pub. Date: May 11, 2018

(65) Prior Publication Data
US 2020/0071815 A1   Mar. 5, 2020

(30) Foreign Application Priority Data

Nov. 4, 2016   (JP) .............................. JP2016-215948

(51) Int. Cl.
*H01J 37/34* (2006.01)
*C23C 14/34* (2006.01)
(Continued)

(52) U.S. Cl.
CPC ........ *H01J 37/3417* (2013.01); *C23C 14/225* (2013.01); *C23C 14/3464* (2013.01);
(Continued)

(58) Field of Classification Search
CPC ............... H01J 37/3417; H01J 37/3447; H01J 37/3441; C23C 14/3435; C23C 14/564;
(Continued)

(56) References Cited

U.S. PATENT DOCUMENTS 10,392,688 B2 *   8/2019  Takei ..................... C23C 14/505
2006/0054494 A1 *   3/2006  Reiss .................. H01J 37/3447
204/192.12

(Continued)

FOREIGN PATENT DOCUMENTS

JP   59222581 A   * 12/1984   ........... C23C 14/225
JP   H06-41733 A   2/1994
(Continued)

*Primary Examiner* — Michael A Band
(74) *Attorney, Agent, or Firm* — Nath, Goldberg & Meyer; Jerald L. Meyer; Tanya E. Harkins

(57) ABSTRACT

A film-forming device according to one embodiment includes a chamber body, a support, a moving device, a shielding member, a first holder and a second holder, in the film-forming device, a substrate supported by the support is linearly moved. The shielding member is disposed above an area where the substrate is moved, and includes a slit extending in a direction perpendicular to a movement direction of the substrate. The first holder and the second holder hold a first target and a second target, respectively, above the shielding member. The first target and the second target are arranged symmetrically with respect to a vertical plane including a linear path on which the center of the substrate is moved.

3 Claims, 7 Drawing Sheets

(51) Int. Cl.
*C23C 14/35* (2006.01)
*C23C 14/22* (2006.01)
*C23C 14/50* (2006.01)
C23C 14/04 (2006.01)
C23C 14/56 (2006.01)

(52) U.S. Cl.
CPC ............ *C23C 14/352* (2013.01); *C23C 14/50* (2013.01); *H01J 37/3447* (2013.01); *C23C 14/044* (2013.01); *C23C 14/3435* (2013.01); *C23C 14/564* (2013.01)

(58) Field of Classification Search
CPC . C23C 14/225; C23C 14/3464; C23C 14/542; C23C 14/044; C23C 14/50
See application file for complete search history.

(56) References Cited

U.S. PATENT DOCUMENTS

| | | |
|---|---|---|
| 2006/0174829 A1 | 8/2006 | An et al. |
| 2007/0095651 A1 | 5/2007 | Ye et al. |
| 2009/0098306 A1 | 4/2009 | Druz et al. |
| 2013/0299345 A1 | 11/2013 | Abarra et al. |
| 2014/0014497 A1 | 1/2014 | Druz et al. |
| 2014/0141624 A1 | 5/2014 | Abarra |
| 2017/0159170 A1 | 6/2017 | Suzuki et al. |
| 2020/0043711 A1* | 2/2020 | Toshima .............. H01J 37/3441 |
| 2020/0048759 A1* | 2/2020 | Shinada ............ H01L 21/67742 |
| 2020/0051796 A1* | 2/2020 | Shinada .............. H01J 37/3435 |

FOREIGN PATENT DOCUMENTS

| | | |
|---|---|---|
| JP | 6-93426 A | 4/1994 |
| JP | 2000-129436 A | 5/2000 |
| JP | 2002-208531 A | 7/2002 |
| JP | 2005-42200 A | 2/2005 |
| JP | 2005-256032 A | 9/2005 |
| JP | 1473343 B2 | 3/2010 |
| JP | 2015-67856 A | 4/2015 |
| JP | 2016-33266 A | 3/2016 |
| KR | 2001-0051306 A | 6/2001 |
| KR | 10-2015-0099841 A | 9/2015 |
| WO | 2011/058812 A1 | 5/2011 |
| WO | 2013179575 A1 | 12/2013 |

* cited by examiner

FILM-FORMING DEVICE

This is a National Phase Application filed under 35 U.S.C. 371 as a national stage of PCT/JP2017/038142, filed Oct. 23, 2017, an application claiming the benefit of Japanese Application No. 2016-215948, filed Nov. 4, 2016, the content of each of which is hereby incorporated by reference in its entirety.

TECHNICAL FIELD

The present disclosure relates to a film-forming device.

BACKGROUND

In the manufacture of electronic devices such as semiconductor devices, a film forming process may be performed to form a film on a substrate. A film-forming device for forming a film by sputtering may be used in the film forming process.

The film-forming device for forming a film by sputtering generally includes a chamber body and a target holder. The target holder holds a target. In the film-forming device, a substrate is accommodated in the chamber body and a gas is supplied into the chamber body. Then, when voltage is applied to the target, ions from a dissociated gas collide with the target. When the ions collide with the target, constituent materials of the target are ejected from the target. The materials ejected from the target are deposited on the substrate. As a result, a film is formed on the substrate.

As one type of film-forming devices, a film-forming device for forming a film by sputtering while linearly moving the center of a substrate in a horizontal plane has been developed. Such film-forming device is disclosed in Patent Document 1. The film-forming device disclosed in Patent Document 1 further includes a shielding member. The shielding member is disposed above an area where the substrate is moved. The shielding member is formed with a slit extending long in a direction perpendicular to the moving direction of the substrate. The target holder holds the target above the shielding member such that the target faces the moved substrate via the slit.

In film formation, it is required that the thickness of a film formed on a substrate, that is, a variation in film thickness, is small. To meet this requirement, in the film-forming device disclosed in Patent Document 1, the target is twice or more as large as the size of the substrate in the direction perpendicular to the moving direction of the substrate.

RELATED ART DOCUMENTS

Patent Document 1: Japanese Patent Publication No. 2015-67856

As described above, in order to reduce a variation in the thickness of a film formed in a film forming process by a film-forming device, it is required that the size of a target is considerably larger than the size of a substrate. However, since the cost of a target having a large size is high, the cost of film formation is accordingly high. Therefore, there is a need to suppress a variation in film thickness and reduce the cost of film formation.

SUMMARY

According to one embodiment of the present disclosure, there is provided a film-forming device for forming a film on a substrate by sputtering. The film-forming device includes a chamber body, a support, a moving device, a shielding member, a first holder, and a second holder. The support is configured to support a substrate within the chamber body. The moving device is configured to move the support. When the support is moved by the moving device, the center of the substrate supported by the support is moved on a linear path in a horizontal plane. The shielding member is disposed above an area where the substrate is moved by the moving device. The shielding member is formed with a slit. The slit extends in a direction perpendicular to a movement direction of the substrate by the moving device and extends symmetrically with respect to a vertical plane including the linear path. The first holder holds a first target above the shielding member such that a first normal direction which is a direction normal to the surface of the first target is inclined downward and the surface of the first target faces the substrate moved by the moving device via the slit. The second holder holds a second target above the shielding member such that a second normal direction which is a direction normal to the surface of the second target is inclined downward and the surface of the second target faces the substrate moved by the moving device via the slit. The first holder and the second holder are disposed to arrange the first target and the second target symmetrically with respect to the vertical plane including the linear path.

In the film deposition device according to one embodiment, two or more targets including the first target and the second target are arranged symmetrically with respect to the vertical plane including the linear path on which the center of the substrate is moved. Therefore, a variation in film thickness in a direction perpendicular to the vertical plane is suppressed. In addition, since the substrate is linearly moved on the linear path, a variation in film thickness of the substrate in the movement direction is also suppressed. Therefore, a variation in in-plane film thickness of the substrate is suppressed. Further, the film-forming device can perform film formation using two or more targets without using a target larger than the size of the substrate. Therefore, using this film-forming device, it is possible to reduce the target cost and further the cost of film formation.

In one embodiment, the film-forming device further includes one or more power supplies and a controller. The one or more power supplies apply voltage to the first target and the second target. The controller controls the application of the voltage to the first target and the second target by the one or more power supplies. The controller controls the one or more power supplies to eject target materials from the first target and the second target simultaneously.

In one embodiment, the first holder and the second holder hold the first target and the second target, respectively, such that the horizontal component of the first normal direction and the horizontal component of the second normal direction are parallel to the movement direction of the substrate. In one embodiment, the first holder and the second holder hold the first target and the second target, respectively, such that a distance between the center of the surface of the first target and the center of the surface of the second target is equal to or greater than one time the width of the substrate in a direction perpendicular to the movement direction, and equal to or smaller than 2.66 times the width of the substrate in the direction perpendicular to the movement direction. According to this embodiment, it is possible to further suppress a variation in the in-plane film thickness of the substrate.

In one embodiment, the first holder and the second holder hold the first target and the second target, respectively, such that the first normal direction and the second normal direction intersect the vertical plane including the linear path. In one embodiment, the first holder and the second holder hold the first target and the second target, respectively, such that the horizontal component of the first normal direction and the horizontal component of the second normal direction make an angle in the range of 20 degrees to 50 degrees with respect to the vertical plane. According to this embodiment, even when the first target and the second target are not far apart from each other, it is possible to further suppress a variation in the in-plane film thickness of the substrate.

According to the present disclosure, it is possible to suppress a variation in film thickness and reduce the cost of film formation.

DETAILED DESCRIPTION

Figure 1:
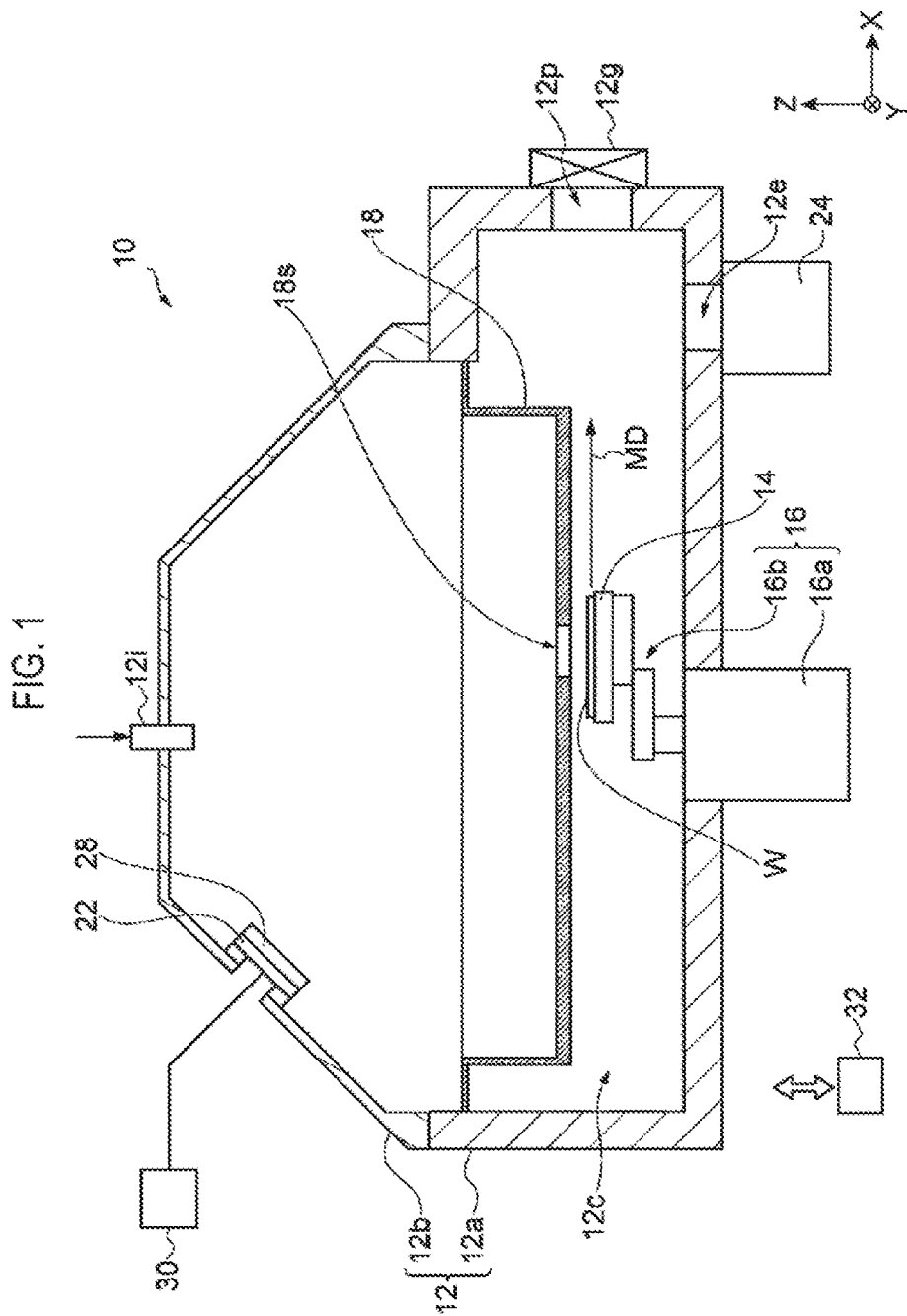
FIG. 1 is a view schematically illustrating a film-forming device according to an embodiment.

Various embodiments will now be described in detail with reference to the drawings. Throughout the drawing, the same or corresponding parts are denoted by the same reference numerals.

Figure 2:
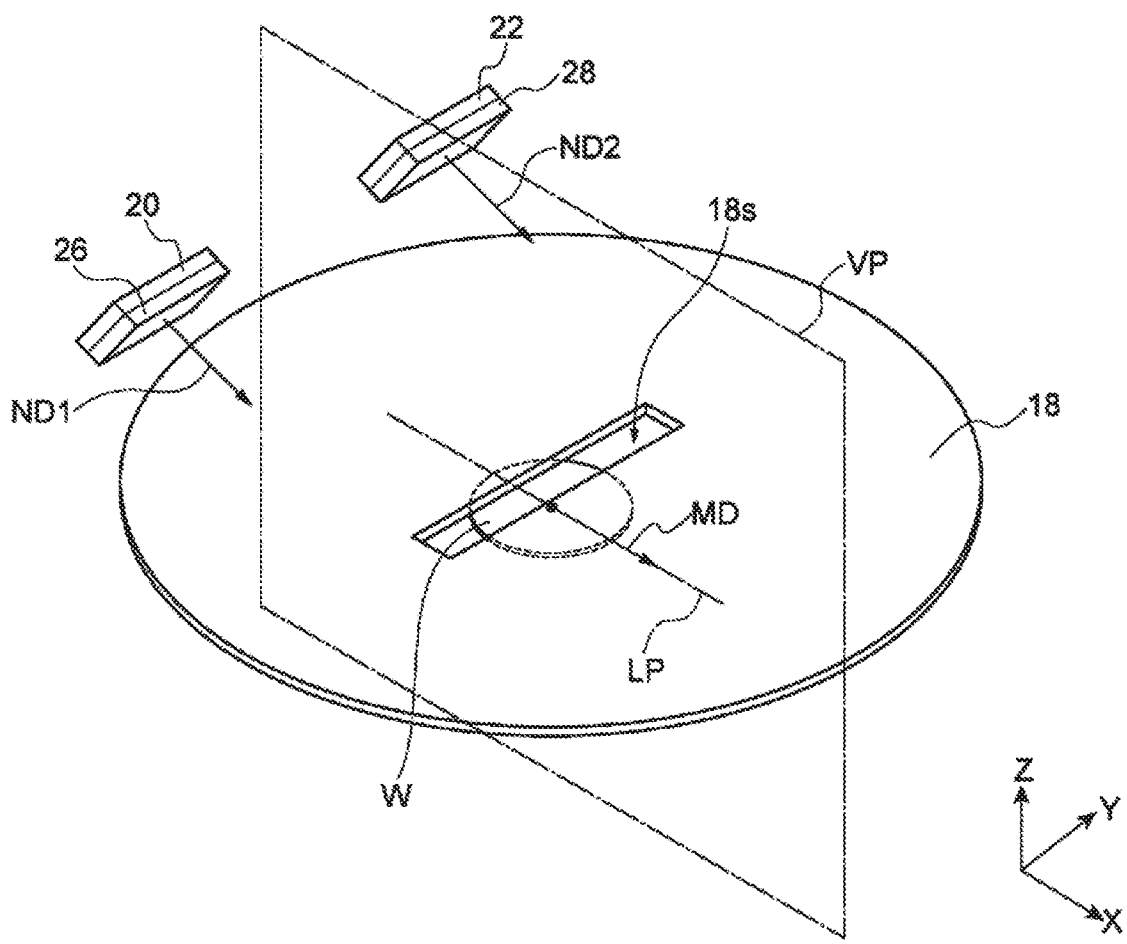
FIG. 2 is a perspective view illustrating a first holder, a second holder, and a shielding member of the film-forming device illustrated in FIG. 1, together with a first target, a second target, and a substrate.
Figure 3:
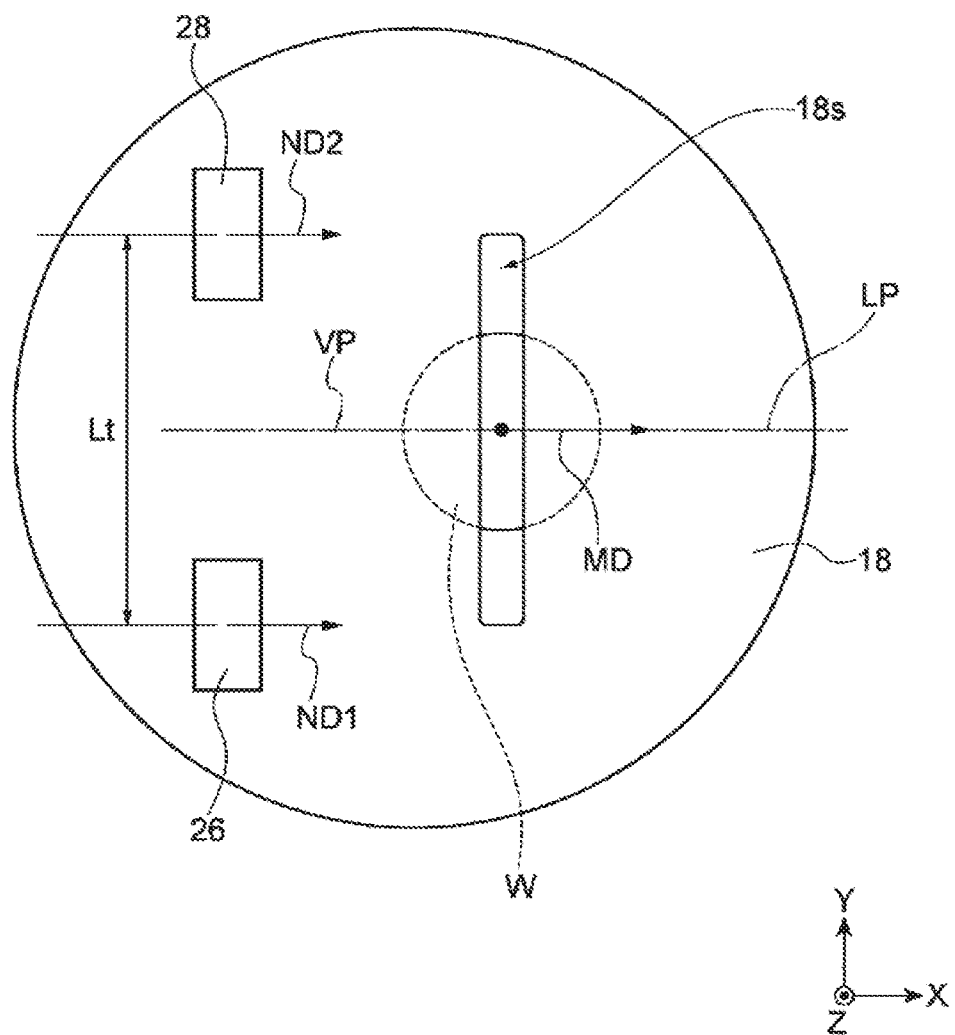
FIG. 3 is a plan view illustrating the shielding member of the film-forming device illustrated in FIG. 1, together with the first target, the second target, and the substrate.

FIG. 1 is a view schematically illustrating a film-forming device according to an embodiment. FIG. 1 illustrates a film-forming device 10 according to an embodiment in a partially-broken form. FIG. 2 is a perspective view illustrating a first holder, a second holder, and a shielding member of the film-forming device illustrated in FIG. 1, together with a first target, a second target, and a substrate. FIG. 3 is a plan view illustrating the shielding member of the film-forming device illustrated in FIG. 1, together with the first target, the second target, and the substrate. The film-forming device 10 is a device that forms a film by sputtering. The film-forming device 10 includes a chamber body 12, a support 14, a moving device 16, a shielding member 18 (or a shield), a first holder 20, and a second holder 22.

The chamber body 12 provides an internal space of the chamber body 12 as a chamber 12c. In one embodiment, the chamber body 12 has a body portion 12a and a lid portion 12b. The body portion 12a may have substantially a cylindrical shape. The upper end of the body portion 12a is opened. The lid portion 12b is disposed on the upper end of the body portion 12a to close the opening of the upper end of the body portion 12a.

An exhaust port 12e is formed at the bottom of the chamber body 12. An exhaust device 24 is connected to the exhaust port 12e. The exhaust device 24 may include a pressure controller and a vacuum pump such as a turbo-molecular pump, a dry pump or the like. An opening 12p is formed in the side wall of the chamber body 12. The opening 12p is installed for loading a substrate W into the chamber 12c and unloading the substrate W from the chamber 12c. The opening 12p can be opened/closed by a gate valve 12g. In addition, a port 12i is installed in the chamber body 12 for introducing a gas into the chamber 12c. A gas, for example, an inert gas, from a gas supplier is introduced in the chamber 12c via the port 12i.

The support 14 is disposed within the chamber body 12, that is, in the chamber 12c. The support 14 is configured to support the substrate W mounted on the support 14. The substrate W has, for example, a disc shape. The substrate W may have a rectangular planar shape. The substrate W is mounted on the support 14 such that the surface of the substrate W is kept substantially horizontal.

The moving device 16 moves the support 14 while keeping the surface of the substrate V horizontal. The moving device 16 moves the support 14, thereby move the center of the substrate W supported by the support 14 on a linear path LP. The linear path LP is a path on a straight line in an imaginary horizontal plane. The linear path LP is a path extending in one direction, that is, a movement direction MD, in the horizontal plane. The movement direction MD coincides with the X direction in FIGS. 1 to 3.

In one embodiment, the moving device 16 may include a driver 16a and an articulated arm 16b. The driver 16a generates a driving force for moving one end of the articulated arm 16b in the X direction. The driver 16a is, for example, a motor. The support 14 is attached to one end of the articulated arm 16b. The other end of the articulated arm 16b is pivotally supported by a drive shaft of the driver 16a.

The shielding member 18 is disposed within the chamber 12c. The shielding member 18 is disposed above an area Where the substrate W is moved by the moving device 16. The shielding member 18 has a plate shape extending substantially horizontally above the area where the substrate W is moved by the moving device 16. This shielding member 18 partitions the chamber 12c into an upper space and a lower space. The lower space in the chamber 12c includes the area where the substrate W is moved by the moving device 16.

A slit 18s is formed in the shielding member 18. The slit 18s penetrates the shielding member 18 in the vertical direction (that is, the Z direction). The slit 18s extends in the Y direction. The Y direction is a direction perpendicular to the X direction in the horizontal plane, and a direction perpendicular to the movement direction MD (that is, the X direction). The slit 18s elongates in the Y direction, and has, for example, substantially a rectangular shape. That is, the width of the slit 18s in the Y direction is larger than the width of the slit 18s in the X direction. The width of the slit 18s in the Y direction is larger than the width of the substrate W in the Y direction. On the other hand, the width of the slit 18s in the X direction is smaller than the width of the substrate w in the X direction. The slit 18s extends symmetrically with respect to an imaginary vertical plane VP. The vertical plane VP is an imaginary plane extending in the X and Z directions and is a plane including the linear path LP.

The first holder 20 holds a first target 26. The first target 26 has, for example, substantially a rectangular planar shape. In one embodiment, the size of the (exposed) surface of the first target 26 is smaller than the size of the substrate W. For example, the width of the (exposed) surface of the first target 26 in the Y direction is smaller than the width of the substrate W in the Y direction. In addition, the width of the (exposed) surface of the first target 26 in the direction perpendicular to the Y direction is smaller than the width of the substrate W in the X direction.

The first holder 20 is made of a conductive material. The first holder 20 is disposed above the shielding member 18. The first holder 20 is attached to the chamber body 12 via an insulating member. In one embodiment, the first holder 20 is attached to the lid portion 12b via an insulating member.

The first holder 20 holds the first target 26 such that the first normal direction ND1 which is the normal direction of the surface of the first target 26 is inclined downward and the surface of the first target 26 faces the moved substrate W via the slit 18s.

The second holder 22 holds a second target 28. The second target 28 has, for example, substantially a rectangular planar shape. In one embodiment, the size of the (exposed) surface of the second target 28 is smaller than the size of the substrate W. For example, the width of the (exposed) surface of the second target 28 in the Y direction is smaller than the width of the substrate W in the Y direction. In addition, the width of the (exposed) surface of the second target 28 in the direction perpendicular to the Y direction is smaller than the width of the substrate W in the X direction.

The second holder 22 is made of a conductive material. The second holder 22 is disposed above the shielding member 18. The second holder 22 is attached to the chamber body 12 via an insulating member. In one embodiment, the second holder 22 is attached to the lid portion 12b via an insulating member.

The second holder 22 holds the second target such that the second normal direction ND2 which is the normal direction of the surface of the second target 28 is inclined downward and the surface of the second target 28 faces the moved substrate W via the slit 18s.

The first holder 20 and the second holder 22 are disposed to arrange the first target 26 and the second target 28 symmetrically with respect to the vertical plane VP including the linear path LP, respectively. In one embodiment, the first holder 20 and the second holder 22 are arranged symmetrically with respect to the vertical plane VP.

In one embodiment, the first holder 20 and the second holder 22 hold the first target 26 and the second target 28, respectively, such that the horizontal component of the first normal direction ND1 and the horizontal component of the second normal direction ND2 are parallel to the movement direction MD.

In one embodiment, the first holder 20 and the second holder 22 hold the first target 26 and the second target 28, respectively, such that a distance Lt between the center of the surface of the first target 26 and the center of the surface of the second target 28 is equal to or greater than one time, and equal to or smaller than 2.66 times the width of the substrate W in the direction (that is, the Y direction) perpendicular to the movement direction MD.

One or more power supplies 30 are electrically connected to the first holder 20 and the second holder 22. The one or more power supplies 30 may be direct current power sources if the first target 26 and the second target 28 are metallic materials. If the first target 26 and the second target 28 are dielectrics or insulators, the one or more power supplies 30 may be high frequency power supplies and are connected to the first target 26 and the second target 28 via a corresponding matching device.

When voltage from the power supply 30 is applied to the first holder 20, the voltage is also applied to the first target 26. When voltage from the power supply 30 is applied to the second holder 22, the voltage is also applied to the second target 28. In one embodiment, the film-forming device 10 includes two power supplies 30, one being electrically connected to the first holder 20 and the other being connected to the second holder 22. In another embodiment, one power supply 30 is electrically connected to both the first holder 20 and the second holder 22.

The film-forming device 10 may include a controller 32. The controller 32 controls each part of the film-forming device 10. The controller 32 is, for example, a computer device and has a processor such as a CPU, and a storage device such as a memory. Programs executed by the processor for controlling each part of the film-forming device 10 and recipe data are stored in the storage device of the controller 32.

In one embodiment, the controller 32 controls the application of voltage from one or more power supplies 30 to the first target 26 and the second target 28. The controller 32 controls the one or more power supplies 30 to eject the respective target materials from the first target 26 and the second target 28 simultaneously. For example, the controller 32 controls the one or more power supplies 30 such that voltage is applied to the first target 26 and the second target 28 simultaneously.

During the film forming process by the film-forming device 10, the substrate W is loaded into the chamber 12c and is mounted on the support 14. Then, a gas from the gas supplier is introduced into the chamber 12c. Further, the chamber 12c is depressurized by the exhaust device 24. Further, while the substrate W is being moved along the movement direction MD by the moving device 16, voltage is applied from the one or more power supplies 30 to the first target 26 and the second target 28. Thereby, constituent materials of the first target 26 and the second target 28 are deposited on the substrate W. As a result, a film is formed on the substrate W. During the film formation on the substrate W, the substrate W may be repeatedly moved on the linear path LP in both the movement direction MD and the opposite direction of the movement direction MD.

In the film-forming device 10, the first target 26 and the second target 28 are held by the first holder 20 and the second holder 22, respectively to be arranged symmetrically with respect to the vertical plane VP. Therefore, a variation in the film thickness in the direction (the Y direction) perpendicular to the vertical plane VP is suppressed. Further, since the substrate W is linearly moved on the linear path LP, a variation in the film thickness of the substrate W in the movement direction MD is also suppressed. Therefore, a variation in the in-plane film thickness of the substrate W is suppressed. Further, the film-forming device 10 can perform film formation using two targets not larger than the size of the substrate W. Therefore, according to the film-forming device 10, it is possible to reduce the target cost and further the cost of film formation.

Further, when a distance between the center of the (exposed) surface of the first target 26 and the center of the (exposed) surface of the second target 28 is set to fall within a range of distance which is equal to or greater than one time, and equal to or smaller than 2.66 times the maximum width of the substrate W in the direction (the Y direction) perpendicular to the movement direction MD, the variation in the in-plane film thickness of the substrate W is further suppressed.

Hereinafter, a first simulation performed for evaluation on the film-forming device 10 will be described. In the first simulation, the thickness of the film formed by the film-forming device 10, that is, a variation in the film thickness in the Y direction, was evaluated. In the first simulation, the distance Lt between the center of the surface of the first target 26 and the center of the surface of the second target 28 was adopted as a variable parameter. The settings in the first simulation were as follows.

<Settings in First Simulation>

Width in the Y direction of the surface of the first target 26: 240 mm

Figure 4:
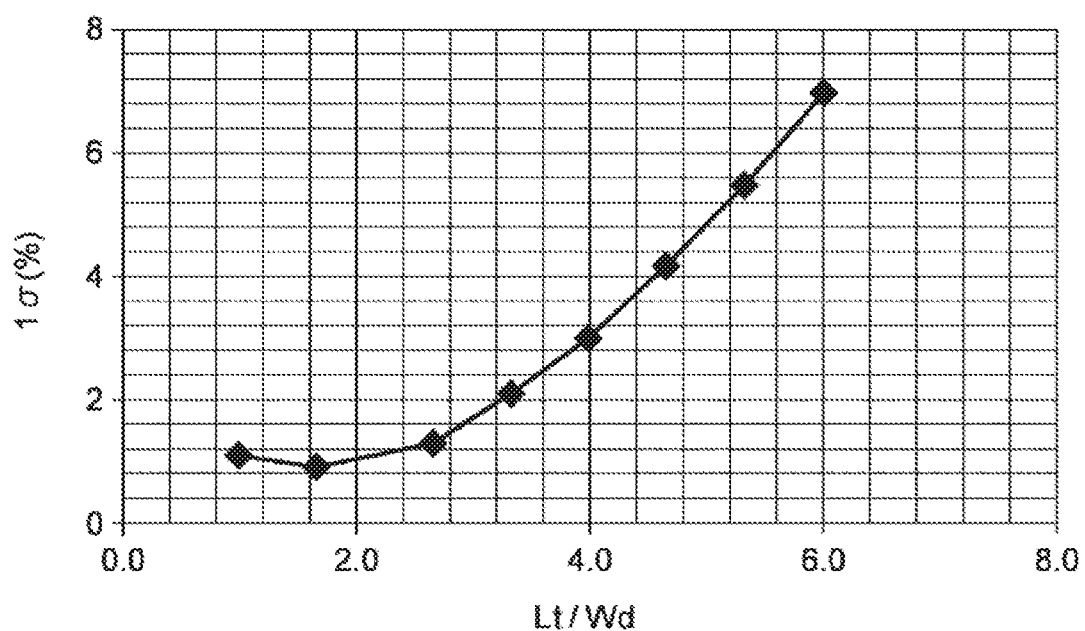
FIG. 4 is a graph showing the results of a first simulation.

Width in the direction perpendicular to the Y direction of the surface of the first target 26: 180 mm Distance in the X direction between the center of the surface of the first target 26 and the center of the slit 18s on the upper surface of the shielding member 18: 245 mm Distance in the Z direction between the center of the surface of the first target 26 and the center of the slit 18s on the upper surface of the shielding member 18: 295 mm Distance in the Z direction between the center of the surface of the first target 26 and the surface of the substrate W: 300 mm Angle between the first normal direction ND1 and the horizontal plane: 52 degrees Width in the Y direction of the surface of the second target 28: 240 mm Width in the direction perpendicular to the Y direction of the surface of the second target 28: 180 mm Distance in the X direction between the center of the surface of the second target 28 and the center of the slit 18s on the upper surface of the shielding member 18: 245 mm Distance in the Z direction between the center of the surface of the second target 28 and the center of the slit 18s on the upper surface of the shielding member 18: 295 mm Distance in the Z direction between the center of the surface of the second target 8 and the surface of the substrate W: 300 mm Angle between the second normal direction ND2 and the horizontal plane: 52 degrees Diameter of the substrate W: 300 mm In the first simulation, the thicknesses (film thicknesses) of the formed film were obtained at a plurality of positions on the diameter of the substrate W in the Y direction, the film thicknesses at the plurality of positions were normalized with the film thickness at the center of the substrate W, and 1σ (%) of the film thickness at each of the plurality of positions was obtained. σ is the standard deviation. FIG. 4 shows the results of the first simulation. In the graph of FIG. 4, the horizontal axis represents Lt/Wd, that is, (the distance between the center of the surface of the first target 26 and the center of the surface of the second target 28)/(the maximum value of the width of the substrate W in the Y direction). In this simulation, the width of the substrate W in the Y direction is the same as the diameter of the substrate W. In the graph of FIG. 4, the vertical axis represents 1σ (%). As shown in FIG. 4, as a result of the first simulation, it is confirmed that a variation in the film thickness becomes relatively small when the Lt/Wd is equal to or greater than 1 and equal to or smaller than 2.66.

Figure 5:
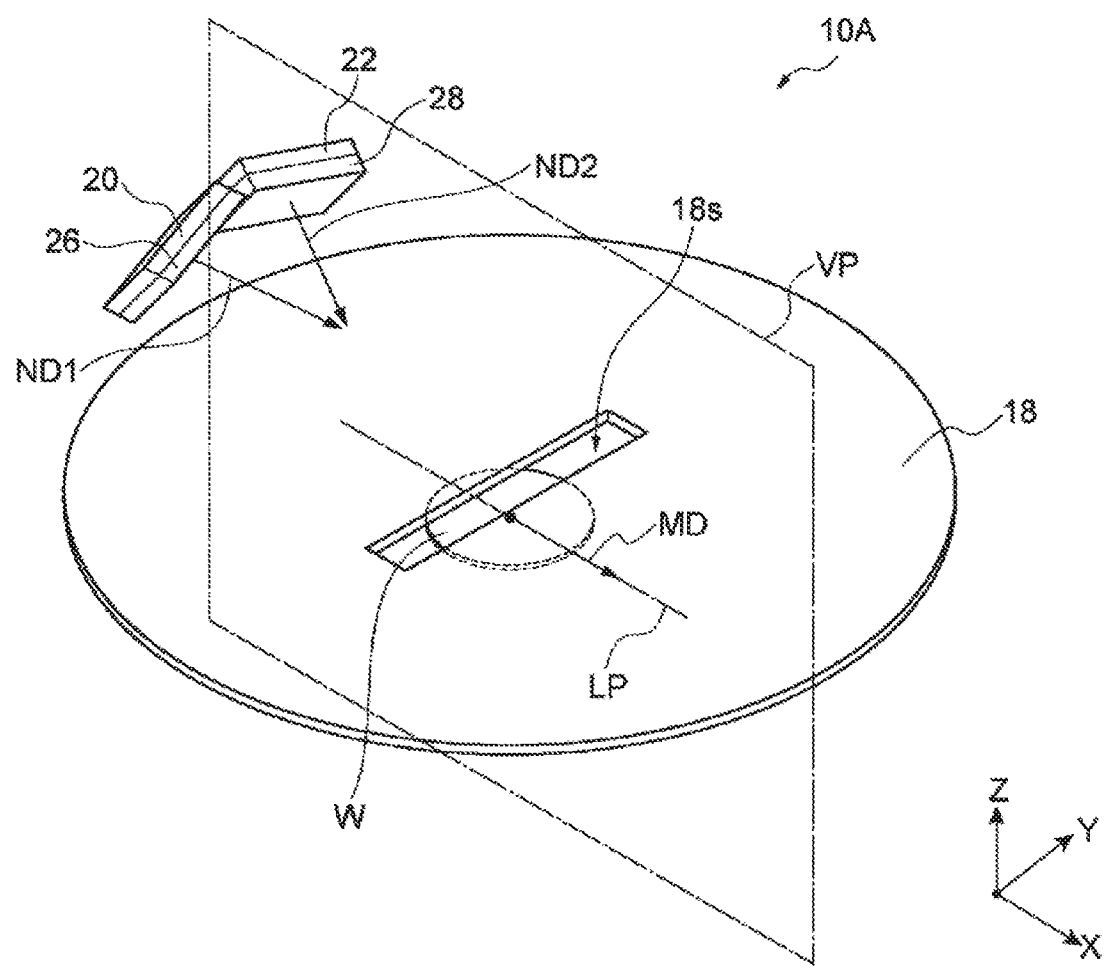
FIG. 5 is a perspective view illustrating a first holder, a second holder, and a shielding member of a film-forming device according to another embodiment, together with a first target, a second target, and a substrate.
Figure 6:
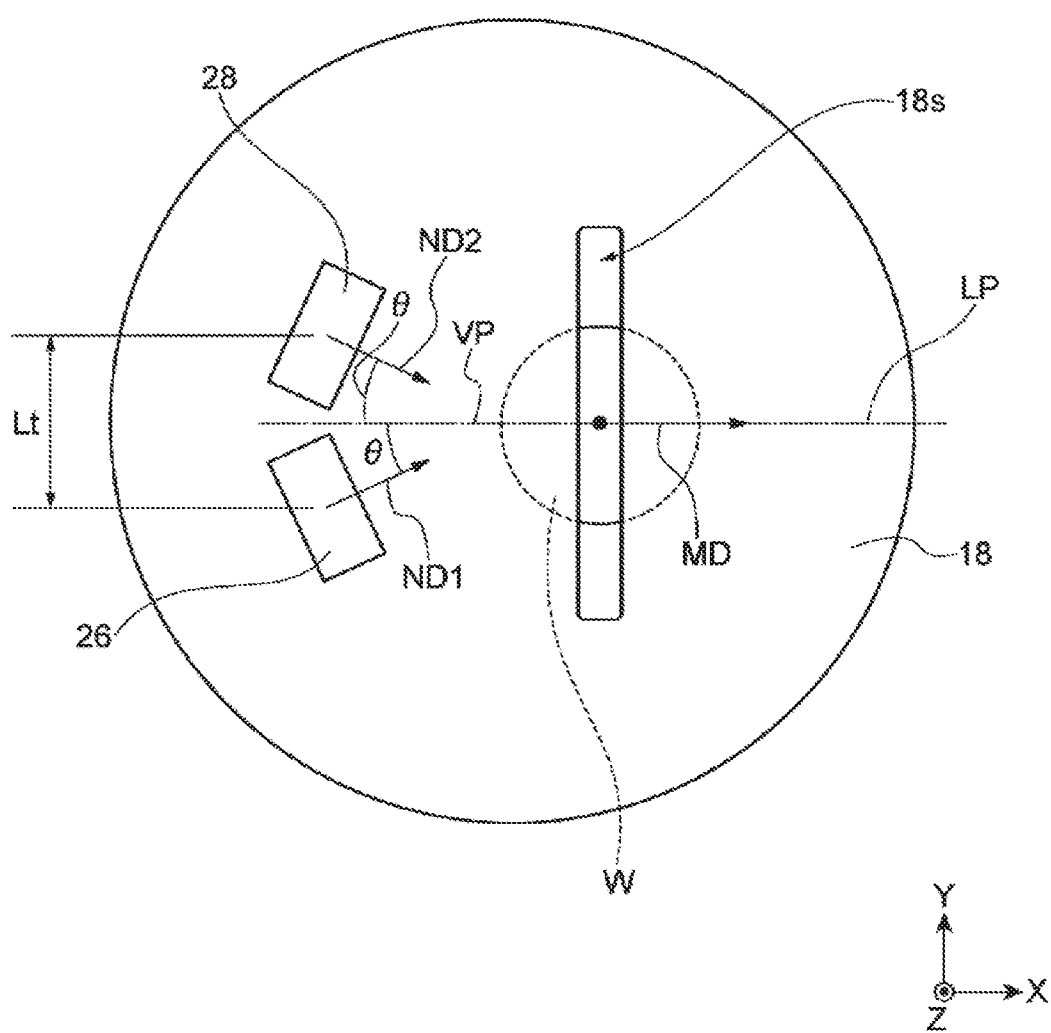
FIG. 6 is a plan view illustrating the shielding member of the film-forming device according to another embodiment, together with the first target, the second target, and the substrate.

Hereinafter, a film-forming device according to another embodiment will be described. FIG. 5 is a perspective view illustrating a first holder, a second holder, and a shielding member of a film-forming device according to another embodiment, together with a first target, a second target, and a substrate. FIG. 6 is a plan view illustrating the shielding member of the film-forming device according to another embodiment, together with the first target, the second target, and the substrate. As illustrated in FIGS. 5 and 6, in the film-forming device 10A according to another embodiment, the first holder 20 and the second holder 22 hold the first target 26 and the second target 28, respectively, such that the first normal direction ND1 and the second normal direction ND2 are inclined downward and intersect the vertical plane VP including the linear path LP. In other words, the first holder 20 and the second holder 22 hold the first target 26 and the second target 28, respectively, such that the first normal direction ND1 and the second normal direction ND2 are inclined downward and make an acute angle with the vertical plane VP. In other respects, the film-forming device 10A has the same configuration as the film-forming device 10 described with reference to FIGS. 1 to 3. According to the film-forming device 10A, even when the first target 26 and the second target 28 are not far apart from each other in the Y direction, a variation in the in-plane film thickness of the substrate W can be suppressed.

As illustrated in FIG. 6, when the first target 26 is held by the first holder 20 and the second target 28 is held by the second holder 22, the horizontal component of the normal direction ND1 of the surface of the first target 26 and the horizontal component of the second normal direction ND2 of the surface of the second target 28 make an angle θ with the vertical plane VP. In one embodiment, the angle θ is equal to or greater than 20 degrees and equal to or less than 50 degrees. When the angle θ is in the range of 20 degrees or more to 50 degrees or less, the variation in the in-plane film thickness of the substrate W is further suppressed.

Hereinafter, a second simulation performed for evaluation on the film-forming device 10A will be described. In the second simulation, the thickness of the film formed in the film-forming device 10A, that is, a variation in the film thickness in the Y direction, was evaluated. In the second simulation, the angle θ was adopted as a variable parameter. The settings in the second simulation were as follows.

<Settings in Second Simulation>

Size of the surface of the first target 26: 240 mm×180 mm

Figure 7:
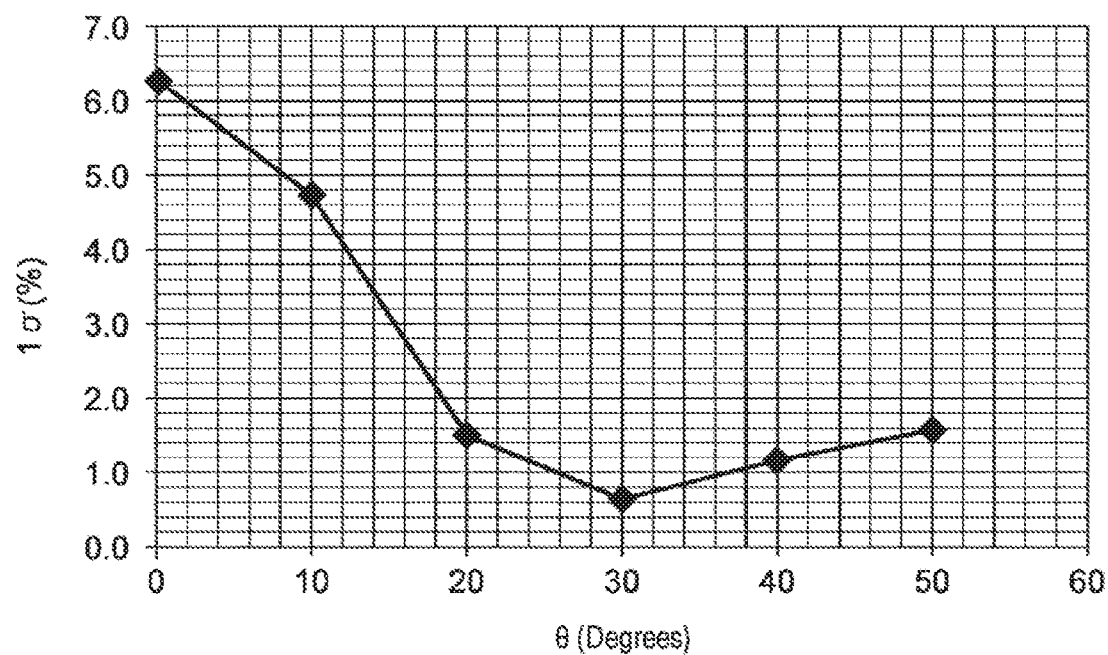
FIG. 7 is a graph showing the results of a second simulation.

Distance in the X direction between the center of the surface of the first target 26 and the center of the slit 18s on the upper surface of the shielding member 18: 265 mm Distance in the Z direction between the center of the surface of the first target 26 and the center of the slit 18s on the upper surface of the shielding member 18: 275 mm Distance in the Z direction between the center of the surface of the first target 26 and the surface of the substrate W: 280 mm Angle between the first normal direction ND1 projected on the vertical plane and the horizontal plane: 52 degrees Size of the surface of the second target 28: 240 mm×180 mm Distance in the X direction between the center of the surface of the second target 28 and the center of the slit 18s on the upper surface of the shielding member 18: 265 mm Distance in the Z direction between the center of the surface of the second target 28 and the center of the slit 18s on the upper surface of the shielding member 18: 275 mm Distance in the Z direction between the center of the surface of the second target 28 and the surface of the substrate W: 280 mm Angle between the second normal direction ND2 projected on the vertical plane and the horizontal plane: 52 degrees Distance between the center of the surface of the first target 26 and the center of the surface of the second target 28: 280 mm Diameter of the substrate W: 300 mm In the second simulation, the thicknesses (film thicknesses) of the formed film were obtained at a plurality of positions on the diameter of the substrate W in the Y direction, the film thicknesses at the plurality of positions were normalized with the film thickness at the center of the substrate W, and (%) of the film thickness at each of the plurality of positions was obtained. σ is the standard deviation. FIG. 7 shows the results of the second simulation. In the graph of FIG. 7, the horizontal axis represents an angle θ. In the graph of FIG. 7, the vertical axis represents 1σ (%). As shown in FIG. 7, as a result of the second simulation, it is confirmed that a variation in the thickness of the formed film becomes considerably small when the angle θ is equal to or greater than 20 degrees and equal to or less than 50 degrees.

While various embodiments have been described above, various modifications can be made without being limited to the above-described embodiments. The above-described film-forming device includes a first holder and a second holder, that is, two holders. However, the film-forming device may include more than two holders. That is, as long as the normal direction of the surface of each of a plurality of targets is inclined downward, the surface of each of the plurality of targets faces a movement area of the substrate via the slit of the shielding member, and the plurality of targets are arranged symmetrically with respect to the vertical plane VP including the linear path LP of the substrate W, the film-forming device may include the same number of holders as the plurality of targets. In addition, some of the plurality of targets held by the plurality of holders may be arranged to intersect the vertical plane VP.

EXPLANATION OF REFERENCE NUMERALS 10, 10A: film-forming device, 12: chamber body, 14: support, 16: moving device, 18: shielding member, 18s; slit, 20: first holder, 22: second holder, 26: first target, 28: second target, 30: power supply, 32: controller, LP: linear path, Lt: distance, MD: movement direction, ND1: first normal direction, ND2: second normal direction, VP: vertical plane, W: substrate

What is claimed is:

1. A film-forming device for forming a film on a substrate by sputtering, comprising:
   a chamber body;
   a support configured to support the substrate within the chamber body;
   a moving device configured to move the support and thereby move a center of the substrate supported by the support on a linear path in a horizontal plane;
   a shield, in which a slit is formed, disposed above an area where the substrate is moved by the moving device, the slit extending in a direction perpendicular to a movement direction of the substrate by the moving device and extending symmetrically with respect to a vertical plane that extends in the movement direction and includes the linear path;
   a first holder configured to hold a first target above the shield such that a first normal direction which is a direction normal to a surface of the first target is inclined downward and the surface of the first target faces the substrate moved by the moving device via the slit; and
   a second holder configured to hold a second target above the shield such that a second normal direction which is a direction normal to a surface of the second target is inclined downward and the surface of the second target faces the substrate moved by the moving device via the slit,
   wherein the first holder and the second holder are disposed to arrange the first target and the second target symmetrically with each other with respect to the vertical plane, such that the vertical plane passes through a gap between the first target and the second target in a plan view, wherein the first target is entirely on one side of the vertical plane, and the second target is entirely on the opposite side of the vertical plane, and wherein both the first target and the second target are on the same side of the slit, and
   wherein the first holder and the second holder hold the first target and the second target, respectively, such that the first normal direction and the second normal direction are both parallel to the movement direction and the vertical plane in the plan view.

2. The film-forming device of claim 1, further comprising:
   one or more power supplies configured to apply voltage to the first target and the second target; and
   a controller configured to control an application of the voltage to the first target and the second target by the one or more power supplies,
   wherein the controller controls the one or more power supplies to eject target materials from the first target and the second target simultaneously.

3. The film-forming device of claim 1, wherein the first holder and the second holder hold the first target and the second target, respectively, such that a distance between a center of the surface of the first target and a center of the surface of the second target is greater than a width of the substrate in the direction perpendicular to the movement direction, and equal to or smaller than 2.66 times the width of the substrate in the direction perpendicular to the movement direction.

* * * * *